United States Patent
Holmes et al.

(10) Patent No.: US 9,368,537 B1
(45) Date of Patent: Jun. 14, 2016

(54) INTEGRATED SILICON CARBIDE ULTRAVIOLET SENSORS AND METHODS

(71) Applicants: James A. Holmes, Fayetteville, AR (US); Matthew Francis, Elkins, AR (US)

(72) Inventors: James A. Holmes, Fayetteville, AR (US); Matthew Francis, Elkins, AR (US)

(*) Notice: Subject to any disclaimer, the term of this patent is extended or adjusted under 35 U.S.C. 154(b) by 0 days.

(21) Appl. No.: 14/604,051

(22) Filed: Jan. 23, 2015

Related U.S. Application Data

(60) Provisional application No. 61/930,642, filed on Jan. 23, 2014, provisional application No. 61/931,864, filed on Jan. 27, 2014.

(51) Int. Cl.
*H01L 29/15* (2006.01)
*H01L 27/146* (2006.01)
*H01L 31/0312* (2006.01)
*H01L 31/11* (2006.01)

(52) U.S. Cl.
CPC ...... *H01L 27/14636* (2013.01); *H01L 31/0312* (2013.01); *H01L 31/1105* (2013.01)

(58) Field of Classification Search
CPC ...... H01L 2924/2021; H01L 31/085–31/1016; H01L 31/11–31/1113
See application file for complete search history.

(56) References Cited

U.S. PATENT DOCUMENTS

| 3,504,181 | A |   | 3/1970  | Hung Chi Chang et al. | 250/83.3    |
|-----------|---|---|---------|-----------------------|-------------|
| 5,093,576 | A |   | 3/1992  | Edmond et al.         | 250/370.01  |
| 5,459,332 | A | * | 10/1995 | Carruthers            | H01L 31/1105 257/17 |
| 5,670,784 | A |   | 9/1997  | Cusack et al.         | 250/372     |
| 6,344,663 | B1|   | 2/2002  | Slater, Jr. et al.    | 257/77      |
| 2010/0276699 | A1| * | 11/2010 | Zhao              | H01L 29/1608 257/76 |

OTHER PUBLICATIONS

"CCD vs. CMOS—Teledyne DALSA Inc." [Online]. Available: http://www.teledynedalsa.com/imaging/knowledge-center/appnotes/ccd-vs-cmos/. [Accessed: Aug. 26, 2013].

R. Augusta, D. E. Foster, J. Ghanhi, J. Eng, and P. M. Najt, "Chemiluminescence Measurements of Homogeneous Charge Compression Ignition (HCCI) Combustion," 1520-2006. [Online]. Available: http://papers.sae.org/2006-01-1520/. [Accessed: Dec. 11, 2013].

M. Jansons, A. Brar, F. Estefanous, R. Florea, D. Taraza, H. Naeim, and W. Bryzik, "Experimental Investigation of Single and Two-Stage Ignition in a Diesel Engine," 1071-2008. [Online]. Available: http://papers.sae.org/2008-01-1071/. [Accessed: Dec. 11, 2013].

(Continued)

*Primary Examiner* — David Vu
*Assistant Examiner* — Cuong Nguyen
(74) *Attorney, Agent, or Firm* — Keisling & Pieper PLC; David B. Pieper

(57) ABSTRACT

A silicon carbide transistor used as an ultraviolet light sensor. The light sensor is mounted inside a probe for detecting ultraviolet light generated by combustion inside an engine. The silicon carbide transistor generates a light voltage that is converted to a digital signal. The digital signal is used in a feedback loop for an engine control module for real time engine control in operating environments. The silicon carbide transistor is mounted inside a glow plug sized engine probe mounted in the cylinder head and the probe includes a quartz window allowing ultraviolet light access between the combustion chamber and the silicon carbide transistor so that the silicon carbide transistor can be mounted proximate the combustion chamber but behind the cooling jackets inside the engine head.

10 Claims, 5 Drawing Sheets

(56) References Cited

OTHER PUBLICATIONS

"Measurements of Thermal Stratification in an HCCI Engine | Combustion Research Facility." [Online]. Available: http://crf.sandia.gov/index.php/measurements-of-thermal-stratification-in-an-hcci-engine/.UrRupxDt5rg. [Accessed: Dec. 20, 2013].

Snap-on Tools, "Snap-on MT1480A Gasoline & Diesel Engine Tack/Timing Meter User Manual." Snap-on Tools, 1990.

"A QC Success Story With the Michigan Army National Guard's Diesel Engine Rebuilding Programme." [Online]. Available: http://www.picoauto.com/applications/diesel-engine-rebuild.html. [Accessed: Dec. 20, 2013].

T. Yoshikawa and R. Reitz, "Effect of Radiation on Diesel Engine Combustion and Heat Transfer," J. Therm. Sci. Technol., vol. 4, No. 1, pp. 86-97, 2009.

"Optrand Products," [Online]. Available: http://www.optrand.com/products.htm. [Accessed: Sep. 23, 2013].

Motortechnischen Zeitschrift, "Beru Glow Plug Pressure Sensor." [Online]. Available: http://www.beru.com/download/produkte/fachaufsatz_psg_en.pdf. [Accessed: Dec. 19, 2013].

Caterpillar, "Diesel Engine Control Systems Application and Installation Guide." Caterpillar, 2008.

\* cited by examiner

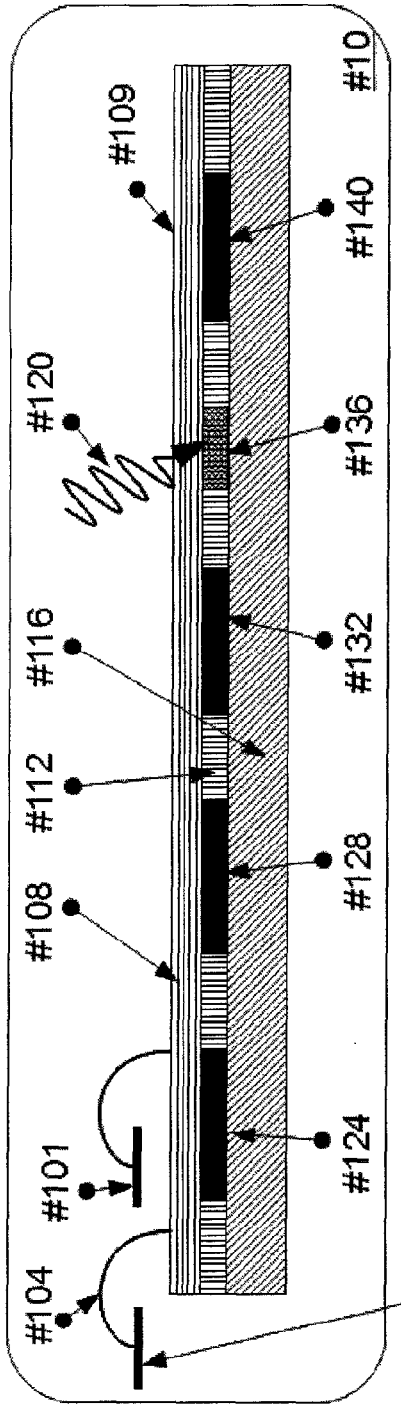
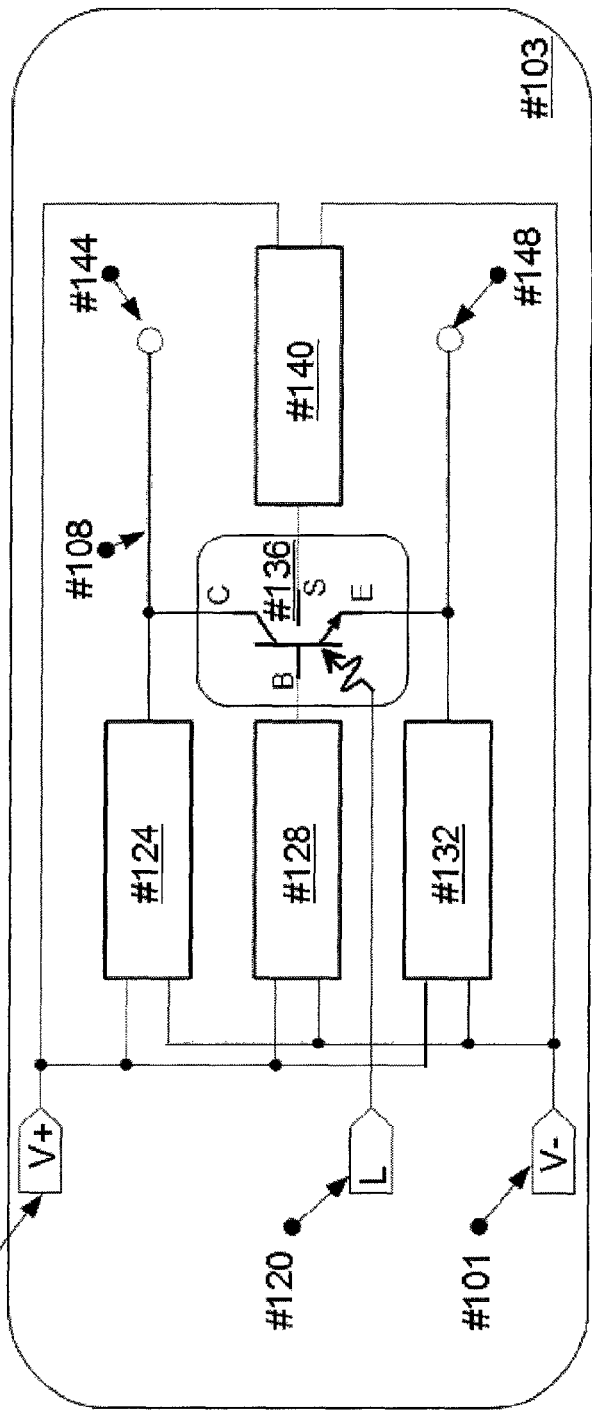
Figure 1a
Figure 1b

INTEGRATED SILICON CARBIDE ULTRAVIOLET SENSORS AND METHODS

CROSS-REFERENCE TO RELATED APPLICATIONS

This application claims priority to and is a continuation-in-part of U.S. Provisional Patent Application Ser. No. 61/930,642, filed on Jan. 23, 2014 entitled INTEGRATED SILICON CARBIDE ULTRAVIOLET SENSOR AND ITS APPLICATION IN IGNITION SIGNATURE SENSORS FOR ENGINE OPTIMIZATION; and U.S. Provisional Patent Application Ser. No. 61/931,864, filed on Jan. 27, 2014 entitled DIGITAL REAL-TIME HOMOGENOUS CHARGE COMPRESSION IGNITION ULTRAVIOLET SIGNATURE FEEDBACK FOR HEUI ENGINE OPTIMIZATION which are hereby incorporated by reference in its entirety.

STATEMENT REGARDING FEDERALLY SPONSORED RESEARCH OR DEVELOPMENT

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in light sensors, probes utilizing the sensors, communication with the sensor, and utilization of the information obtained from the sensor, specifically in real-time, operating-environment engine control and optimization in engines generating ultraviolet light with useful information, for example diesel engines. More particularly, the invention relates to improvements in integrated circuits and sensors in planar semiconductor processes including a silicon carbide lateral bipolar junction transistor that is monolithically integrated to create an ultraviolet sensor and pre-amplifier for further integration in very large scale integrated circuits. One use of the invention relates to the field of electronic sensors and controls for internal combustion engines and the development of digital real time homogenous charge compression ignition ultraviolet signature feedback for hydraulically actuated electronic unit injection, HEUI, engine optimization.

2. Description of the Known Art

As will be appreciated by those skilled in the art, light sensors, engine probes, and engine control systems are known in various forms.

For light sensors, silicon-based imaging technologies will absorb ultraviolet, visible and infrared photons and generate electron-hole pairs. If the application requires sensitivity only to ultraviolet light, costly steps must be taken to filter out the visible and infrared spectrum by using filtering optics or additional thin film processing.

In Silicon CMOS or Silicon CCD technologies, ultraviolet photons are absorbed very close to the silicon surface. Therefore, ultraviolet imagers must not have polysilicon, nitride or thick oxide layers that impede the absorption of ultraviolet photons. Modern ultraviolet imagers are hence backside thinned, most with only a very thin layer of Argon coating on top of the silicon imaging surface. Backside thinning drives up the cost of the ultraviolet imager, the associated packaging, and reduces mechanical reliability.

Although backside thinning is now ubiquitous in mobile imagers, ultraviolet response is not. To achieve a stable ultraviolet response, the imager surface requires special surface treatment, regardless of whether the imager is Silicon CMOS or Silicon CCD. Many backside-thinned imagers developed for visible imaging have thick oxide layers that can discolor and absorb ultraviolet after extended ultraviolet exposure. Some backside-thinned imagers have imaging surfaces that are passivated by a highly-doped Boron layer that extends too deep into the silicon epitaxy, causing a large fraction of ultraviolet photo-generated electrons to be lost to recombination.

Ultraviolet response and backside thinning are achievable in all line scan imagers, but not all area imagers. No global shutter area Silicon CCD can be backside thinned. The situation is better in Silicon CMOS area imagers, though still not without trade-offs. Silicon CMOS area imagers with rolling shutters can be backside thinned. Conventional Silicon CMOS global shutter area imagers have storage nodes in each pixel that need to be shielded when thinned, but only if these ultraviolet sensitive imagers will also be imaging in the visible spectrum. In backside-thinned area imagers, it is not possible to effectively shield part of the pixel from incident illumination, without severely degrading the imager's fill factor, the ratio of the light sensitive area to the total pixel area. There are other types of Silicon CMOS global shutter area imagers that do not have light sensitive storage nodes, but have higher noise, lower full well, rolling shutter, or a combination of these. Silicon also has a limited operating range typically above negative 40° C. and below 125° C.

In another field, the use of homogenous charge compression ignition, HCCI, in diesel engines produces an optical emission with an infrared, visible, and ultraviolet spectrum. The spectral response of this emission produces a unique photon signature that depends on fuel type, engine health, and evolution of pollutants in the combustion process. A portion of the optical signature can be transduced to an electrical signature by the emitted photons that have an energy greater than the excitation band-gap energy of a solid state semiconductor photo-detector. The state of the art is to capture this signature in a laboratory environment using optically accessible engines. The sensor electronics and signal processing used in the laboratory instruments are sensitive, bulky, and not suitable to real-time signal processing, thus preventing the use of the HCCI signature in practical engine control algorithms. More importantly these instruments require precise temperature management to improve the signal to noise ratio of the HCCI emission signature with respect to the back ground radiation of the engine block. These instruments also require complex optical filters and prisms to discriminate photons of different energies or wavelengths, for example, infrared, visible and ultraviolet wavelengths. Thus, the information gathered from these instruments is used to improve over-all design of diesel engines but is not applicable to the run-time operation of practical engines. The optical signature of the HCCI contains useful information such as the timing of the ignition, intensity, and duration of the combustion, the evolution of the combustion process, and engine health. As such, the optical signature is used in diesel engine diagnostic equipment. The required proximity of the light sensors in these diagnostic tools requires complicated procedures and short test times. Consequently less invasive diagnostic techniques involving measurement of exhaust and blow-back are more commonly used in evaluating engine health.

The HCCI optical signature has been correlated to the pressure signature through studies in HCCI heat release rate. Consequently, other solutions capture the pressure signature of the HCCI. Solutions using the pressure signature involve moving parts, such as deformable diaphragms and spring loaded systems and therefore suffer reliability issues. Consequently, reliable diesel engine design is limited to mechanical feedback systems such as flywheel sensors to control the timing of diesel fuel injection based only on crank angle, which severely limits the ability for run-time optimization of diesel engine performance.

Patents disclosing information of interest include: U.S. Pat. No. 3,504,181, issued to Chang, et al. on Mar. 31, 1970 entitled Silicon carbide solid state ultraviolet radiation detector;

U.S. Pat. No. 5,093,576, issued to Edmond, et al. on Mar. 3, 1992 entitled High sensitivity ultraviolet radiation detector;

U.S. Pat. No. 5,670,784, issued to Cusack, et al. on Sep. 23, 1997 entitled High temperature gas stream optical flame sensor;

U.S. Pat. No. 6,344,663, issued to Slater, Jr, et al. on Feb. 5, 2002 entitled Silicon carbide CMOS devices. Other publications include United States Patent Application 20060261876 A1, filed by Agarwal; Anant K. et al. on Nov. 23, 2006 entitled Optically triggered wide bandgap bipolar power switching devices and circuits. Each of these patents and publications are hereby expressly incorporated by reference in their entirety.

Other references teaching information that may be considered include:

"CCD vs. CMOS—Teledyne DALSA Inc." [Online]. Available: http://www.teledynedalsa.com/imaging/knowledge-center/appnotes/ccd-vs-cmos/. [Accessed: 26 Aug. 2013].

R. Augusta, D. E. Foster, J. Ghanhi, J. Eng, and P. M. Najt, "Chemiluminescence Measurements of Homogeneous Charge Compression Ignition (HCCI) Combustion," 1520-2006. [Online]. Available: http://papers.sae.org/2006-01-1520/. [Accessed: 11 Dec. 2013].

M. Jansons, A. Brar, F. Estefanous, R. Florea, D. Taraza, H. Nacim, and W. Bryzik, "Experimental Investigation of Single and Two-Stage Ignition in a Diesel Engine," 1071-2008. [Online]. Available: http://papers.sae.org/2008-01-1071/. [Accessed: 11 Dec. 2013].

"Measurements of Thermal Stratification in an HCCI Engine | Combustion Research Facility." [Online]. Available: http://crf.sandia.gov/index.php/measurements-of-thermal-stratification-in-an-hcci-engine/.UrRupxDt5rg. [Accessed: 20 Dec. 2013].

Snap-on Tools, "Snap-on MT1480A Gasoline & Diesel Engine Tack/Timing Meter User Manual." Snap-on Tools, 1990.

"A QC Success Story With The Michigan Army National Guard's Diesel Engine Rebuilding Programme." [Online]. Available: http://www.picoauto.com/applications/diesel-engine-rebuild.html. [Accessed: 20 Dec. 2013].

T. Yoshikawa and R. Reitz, "Effect of Radiation on Diesel Engine Combustion and Heat Transfer," J. Therm. Sci. Technol., vol. 4, no. 1, pp. 86-97, 2009.

"Optrand Products." [Online]. Available: http://www.optrand.com/products.htm. [Accessed: 23 Sep. 2013].

Motortechnischen Zeitschrift, "Beru Glow Plug Pressure Sensor." [Online]. Available: http://www.beru.com/download/produkte/fachaufsatz_psg_en.pdf. [Accessed: 19 Dec. 2013].

CATERPILLAR, "Diesel Engine Control Systems Application and Installation Guide." CATERPILLAR, 2008.

Each of these publications are also hereby expressly incorporated by reference in their entirety.

From these prior references it may be seen that these prior art patents are very limited in their teaching and utilization, and an improved sensor, probe, communication system, and engine control system are needed to overcome these limitations.

SUMMARY OF THE INVENTION

The present invention is directed to an improved light sensor, applications, and methods. In accordance with one exemplary embodiment of the present invention, a high sensitivity ultraviolet light sensor is provided. One advantage of this is providing a sensor with high sensitivity to a controlled bandwidth of ultraviolet light. Another advantage is providing a sensor with no sensitivity to visible or infrared light. A still further advantage is providing a sensor with high reliability in the presence of ultraviolet light. Yet a further advantage is a silicon carbide sensor with high reliability when operating at temperature extremes including temperatures below negative 55° C. or above 400° C. thereby greatly exceeding the range of silicon. Another advantage is a sensor that is integrated monolithically with silicon carbide, SiC, bipolar and complimentary metal-oxide-semiconductor, BiCMOS, biasing circuits, and other signal amplification and signal conditioning circuits availed by large-scale integration.

Another embodiment of the present invention is a miniaturized electronic sensor that uses a wide band-gap solid-state photo-detector to capture an HCCI optical signature within or in close proximity to a diesel engine. The sensor selectively transforms the deep ultraviolet portion of the HCCI optical signature to an electrical analog signature that is subsequently converted to a real-time digital signature. An example of such signature is that which is created by the emission peak of the hydroxyl radical at a wavelength of 310 nanometers and with energy of 4 electron-volts.

A still further embodiment of the present invention is the use of the sensor in a new feedback loop for the run-time optimization of diesel engines. The feedback comes from measuring the ultraviolet signature from the homogenous charge compression ignition, HCCI process. The ultraviolet signature from each combustion chamber in a diesel engine is converted to a digital data stream. Information is extracted from the data stream with a signal processing module. Extracted information includes, but is not limited to: ignition timing, combustion duration, combustion intensity, fuel type, fuel quality, and evolution of pollutants. Other information can be derived from this data such as engine health, performance, and efficiency.

These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction there-with, and in which like reference numerals have been employed throughout wherever possible to indicate like parts in the various views:

FIG. 1a shows a side cutaway view of a laterally arranged silicon carbide bipolar sensor device depicted as an NPN device integrated with silicon carbide BiCMOS biasing circuitry and followed by integrated silicon carbide amplification, data conversion, and signal processing circuitry.

FIG. 1b shows the electrical schematic of the circuit of FIG. 1a.

DETAILED DESCRIPTION OF THE INVENTION

Figure 2B:
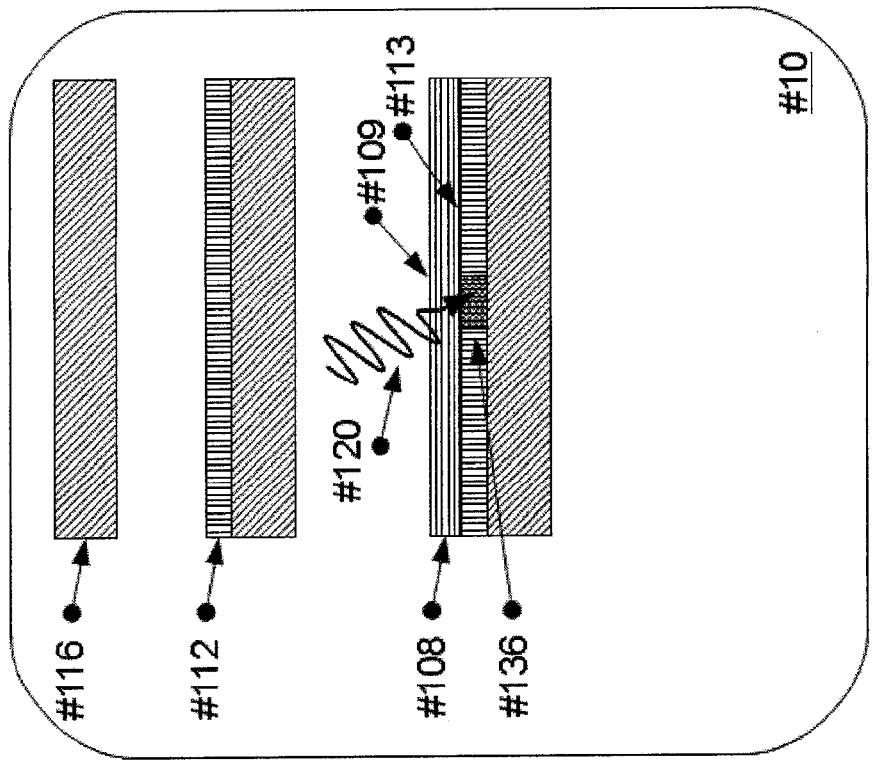
FIG. 2b shows a non-thinned uniform backside sensor of the present invention.

As shown in FIG. 1 of the drawings, one exemplary embodiment of the present invention is generally shown as a silicon carbide integrated circuit sensor 10 containing the ultraviolet sensitive silicon carbide bipolar transistor 136 and its biasing circuitry 103 along with a corresponding schematic shown in FIG. 1b. The cross-section, not shown to scale, is comprised of layers common to a silicon carbide BiCMOS process. A silicon handle wafer 116 supports a silicon carbide epitaxial layer 112 where active and passive devices are formed with lithography. These devices are connected electrically with interconnect layers 108. The interconnect layers are wire bonded 104 to a package lead 100 for connection to a multi-chip application. A silicon carbide lateral bipolar junction transistor 136, with an NPN type depicted, is a four-terminal electrical device, Base B, Emitter E, Collector C and Substrate S, with an additional fifth input that is ultraviolet light 120 shining on the Base-Emitter PN junction B-E. A PNP configuration may also be used. Ultraviolet photons with energies greater than the band-gap energy of silicon carbide at 3.34 electron-volts generate electron-hole pairs in the Base-Emitter depletion region. The electron-hole pairs are swept across Base-Emitter P—N junction by the built-in voltage of the junction to form a Base-Emitter current. The Base-Emitter current modulates the Collector-Emitter current with the inherent current gain of the lateral bipolar junction transistor to create an ultraviolet light sensor. The Collector-Emitter current is transduced to a voltage at the collector or emitter by other BiCMOS devices and circuits integrated with the sensor. The Base B, Emitter E, Collector C and Substrate S connections are biased by circuits that are monolithically integrated with the sensor 136. The biasing circuits 103 may be simple, complex, or in some cases unconnected. Each electrical bipolar junction transistor connection B, C, E, S can have a corresponding bias circuit, these can include the collector bias circuit 124, the base bias circuit 128, the emitter bias circuit 132, and the substrate bias circuit 140. These bias circuits 124, 128, 132, 140 are comprised of silicon carbide active and passive devices such as, but not limited to N-channel MOSFETs, P-Channel MOSFETs, diffusion resistors, poly-silicon resistors, capacitors, diodes, bipolar junction transistors, and the interconnects 108 are provided by the silicon carbide integrated circuit process. The sensor device 136 can thus be electrically biased as a two, three, or four terminal device to amplify and transform the photocurrent into measurable currents and voltages across the output nodes 144, 148 that are modulated by the collector C or the emitter E. Further amplification, data conversion and signal processing can be applied through large scale integration with the other integrated circuit functions 124, 128, 132, 140. Note that these can be complex circuits, a simple wire, or nothing at all depending on the application but that these are monolithically integrated with the sensor device.

The silicon carbide lateral bipolar junction transistor 136 is created in a silicon carbide complementary metal oxide semiconductor, CMOS, process such as those described in the prior art, and is electrically biased with integrated electrical devices and electrical interconnects that are made available in the process. A lateral bipolar junction transistor 136 is formed using process drafting rules and is formed with its terminals connected from the top surface 110 of the sensor 10. Ultraviolet light 120 shining on the lateral bipolar junction transistor 136 modulates the collector-emitter current, effectively transducing ultraviolet light to current. The ultraviolet light-modulated current is amplified by additional circuitry such as CMOS and BiCMOS amplifier circuit topologies.

Figure 2A:
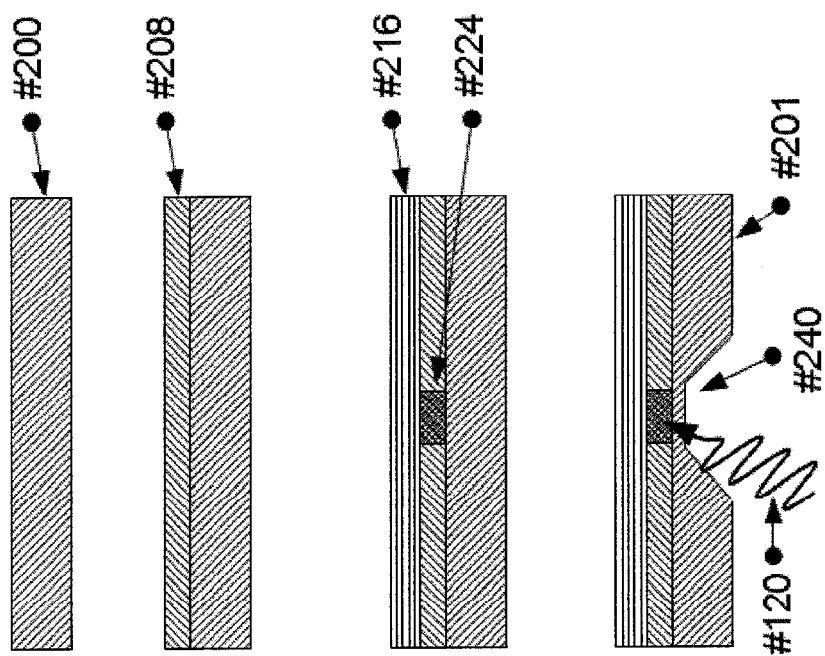
FIG. 2a shows prior art back-side thinned sensor.

FIG. 2a shows the disadvantages of the prior art silicon light sensors which can be compared against the advantages of FIG. 2b that shows the present invention's silicon carbide lateral bipolar junction transistor 136 as a light sensor 10. Both solutions begin with a handle wafer 116, 200 which is typically made from silicon. FIG. 2a shows how prior art solutions use a silicon epitaxial layer 208 to form active devices and photo-sensitive devices. In contrast, FIG. 2b shows the present invention's use of a silicon carbide epitaxial layer 112 to form electronic devices and UV sensitive devices 136. Lithography is used to form the light sensitive devices 224 in the silicon epitaxial layer 208 and similarly the light sensitive device 136 in the silicon carbide epitaxial layer 112. As noted by FIG. 2a, the prior art solution's high absorption rate of ultraviolet photons in the silicon epitaxial layer 208 prevents ultraviolet photons from penetrating to the active regions of the photo-sensitive device. Consequently other solutions require additional expensive processing of the handle wafer 200 such as additional lithography to back-side thin 240 the handle wafer 200 such that ultraviolet light 120 can reach the photo-sensitive device 224 from the back side 201 of the handle wafer 200. As seen by FIG. 2a, back-side thinning 240 required for silicon sensors mechanically weakens the silicon substrate 200. Furthermore, minute variations in substrate 200 thickness results in large variations in sensitivity to light intensity. In contrast, FIG. 2b shows how the absorption of ultraviolet light in silicon carbide 112 is lower enabling more ultraviolet light 120 to reach the active regions of the silicon carbide device 136 through the electrical conduction layer 108 and the top surface 113 of the silicon carbide epitaxial layer 112. The design of the present invention in FIG. 2b allows selective sensitivity to ultraviolet light wavelengths in approximately the 200 nanometer to 350 nanometer range that is determined by the band gap of the silicon carbide 112 of 3.36 eV. Consequently, backside thinning 240 is not required and the sensitivity to light is consistent among multiple sensors, because the thickness of the interconnect layers 108 is well controlled. The electrical insulating layers within 216 and 108 are generally formed of Si3N4, and/or SiO2 (silicon dioxide). The electrical conductions layers within 216 and 108 are typically formed of Al (aluminum) and Poly-silicon. Modern processes enable fine control of these layers's thicknesses. Routing of electrical conduction layers in 108 can be optimized to create a light penetration zone 109 to allow light to reach the silicon carbide epitaxial layer 112. The present invention's conduction layer 108 is specifically designed to allow for ultraviolet light penetration at zone 109. By allowing the light through the layer 108 and using silicon carbide layer 112, there is a significant advantage over the prior art in the comparative penetration depth of UV photons, which is shallow in 224 and deeper in 136. Consequently the prior art uses silicon epitaxial layers and flip chip mounting in combination with etching of the handle wafer 200 to expose the active device 224 from the back side 201. In contrast, the present invention does not need this expensive etching and flip chip mounting processing step since UV photons penetrate well through the light penetration zone 109 and through the top side 113 into the active device 136 in the silicon carbide epitaxial layer 112.

Figure 3B:
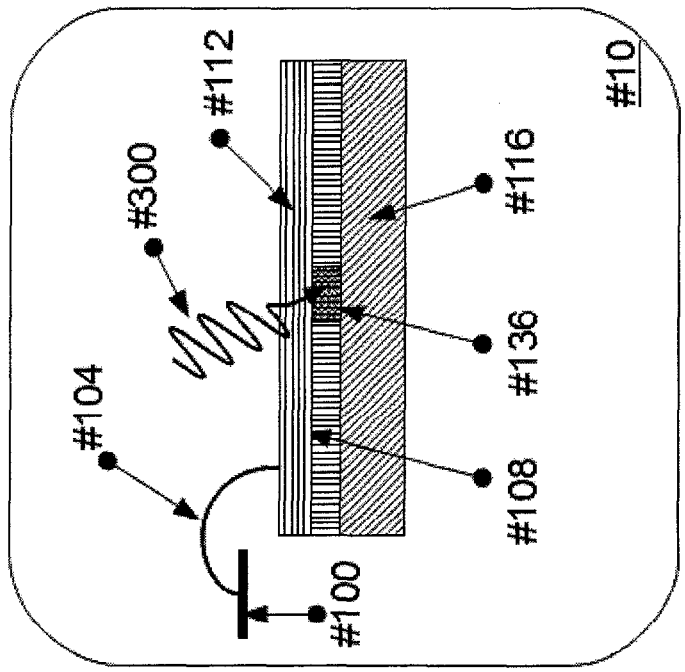
FIG. 3b shows a non thinned, non flipped sensor of the present invention.
Figure 3A:
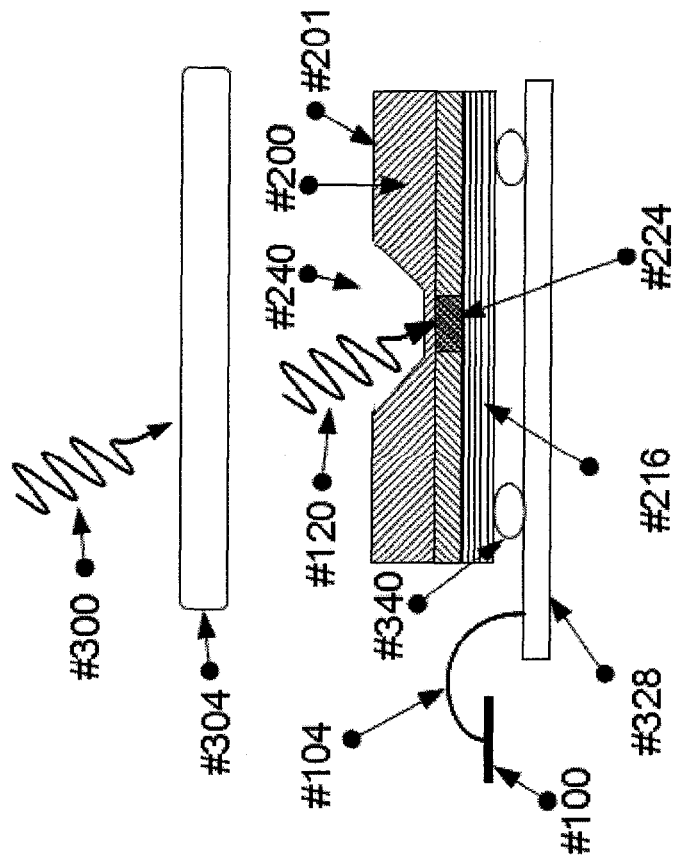
FIG. 3a shows a prior art back-side thinned flip chip assembly.

FIG. 3a shows the interconnections for the prior art's flip chip with back side thinning which can be compared against FIG. 3b showing the present invention and the simple top connections. The relative thickness of the two different solutions can be seen in this comparison. By using the selective sensitivity of silicon carbide in the sensor 136 and by eliminating the need for the back-side thinned 240 handle wafer 200 the present invention's FIG. 3b solution simplifies packaging of the integrated ultraviolet sensor 10 and its companion circuitry in the silicon carbide epitaxial layer 112. FIG. 3a uses integrated silicon photo-sensitive devices 224 which compares against FIG. 3b showing the present invention's silicon carbide photo-sensitive bipolar junction transistor 136. Solutions using a silicon device 224 will be sensitive to photon energies greater than the band gap energy of silicon which is 1.12 electron-volts. Photon energies above 1.12 electron-volts include broad wavelength light 300 which include subsets of undesired infrared light and visible light, and the desired ultraviolet light 120. For selective sensitivity to ultraviolet light 120, an optical filter 304 must be used such that only photons with energies above 3.34 electron volts in a filtered light 120 reach the silicon sensor 224. Filtration of infrared and visible light increases the size and complexity of the packaging. In contrast, the silicon carbide lateral bipolar junction transistor 136 will only generate photo-currents from photons with energies greater than the band gap of silicon carbide and therefore does not require any optical filters. Other solutions are further complicated by the need for ultraviolet light to penetrate through the back-side thinned 240 portion of the handle wafer 200. These solutions require the interconnect layers 216 to be flip-chip mounted to another interconnection substrate 328 with solder balls 340. The carrier substrate 328 is then wire bonded 104 to the lead frame connectors 100. In contrast, the integrated silicon carbide sensor 10 enables wire bonding 104 directly from the lead frame connectors 100 to the interconnect layers 108.

Figure 4:
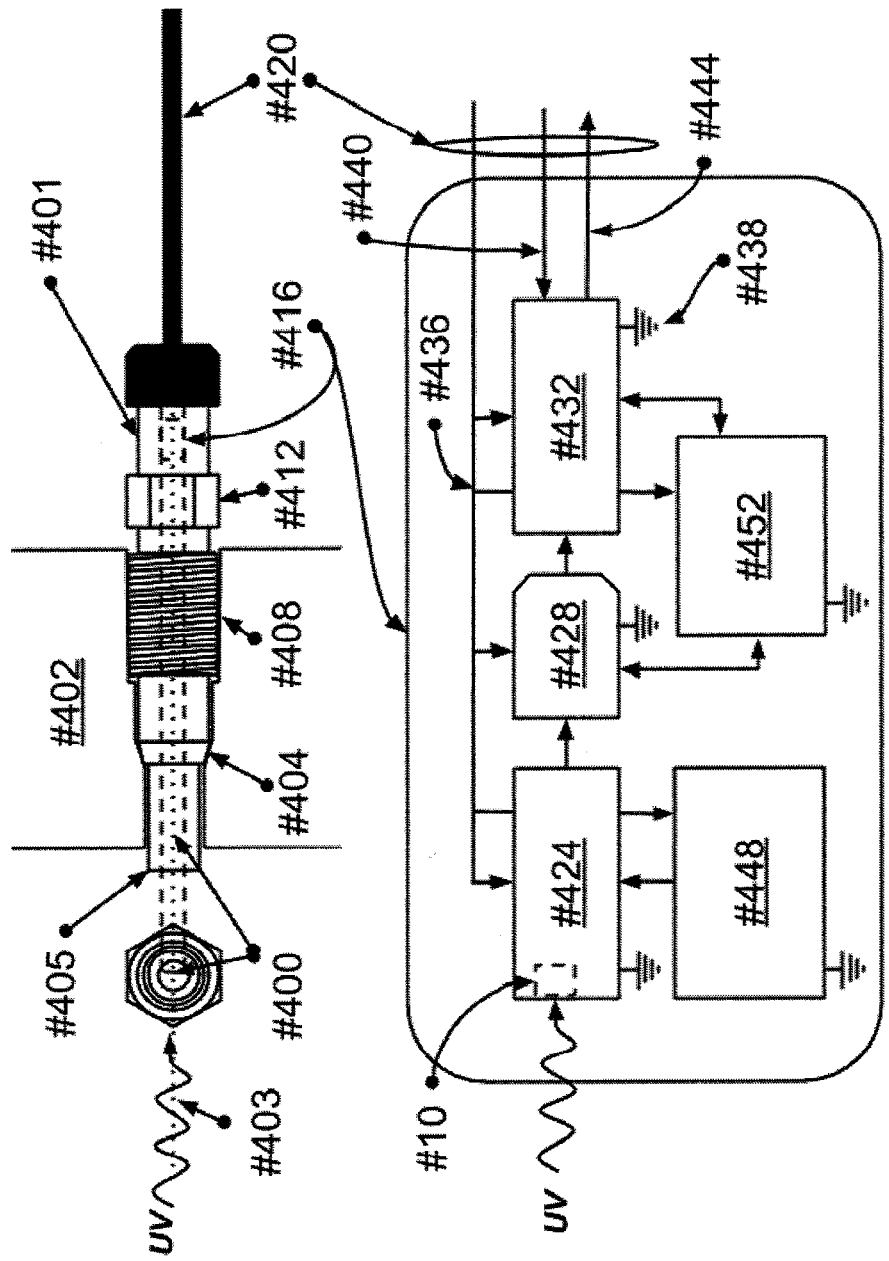
FIG. 4 shows a high temperature miniaturized ultraviolet emission digitizer.
Figure 5:
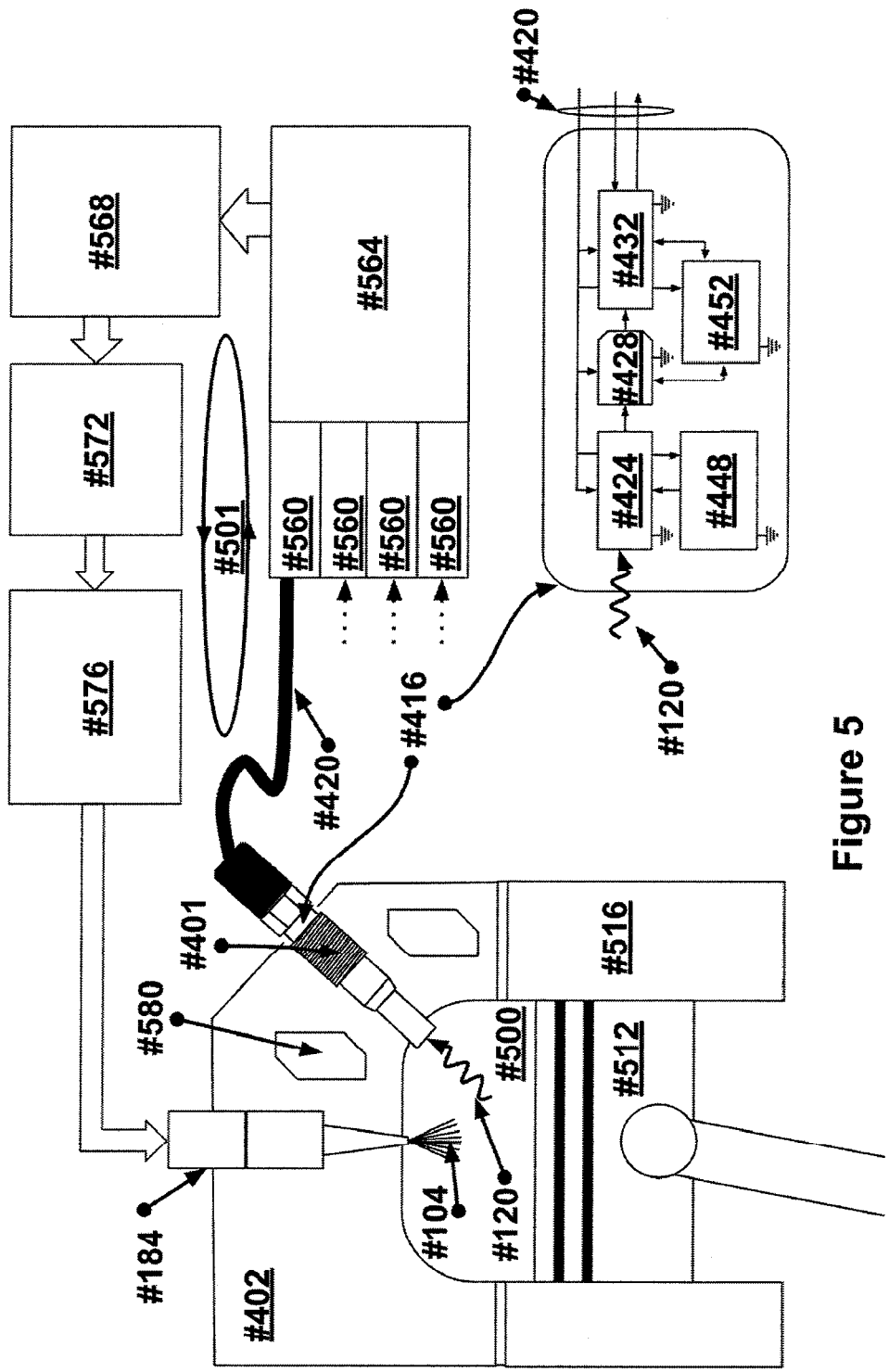
FIG. 5 shows an HCCI ultraviolet digital signature processing feedback loop for real-time diesel engine tuning.

FIG. 4 shows the design of a probe 401 utilizing the sensor 10. The ultraviolet signature from the HCCI in a diesel engine combustion chamber passes through a quartz window 400 into the probe casing 404. The quartz window 400 is secured in the centerline 403 in the probe 401 passing from the combustion chamber end 405 to the sensor 10. Note that the sensor can be the previously described silicon carbide transistor 136 or another silicon carbide device could also be utilized. In this design, the probe casing 404 has a form factor similar to a glow plug with compatible threading 408 for a glow plug fitting in an engine block head 402 as shown in FIG. 4 and FIG. 5. The probe casing 404 is threaded in the glow plug type fitting and then tightened with a tool using the torque facets 412 to provide mechanical fit and electrical ground contact to the engine block head 402. Encapsulated within the probe casing 404 is the sensor electronics module 416. The module 416 is portioned into one or more integrated circuit functions including the sensor 10 that is positioned to receive ultraviolet light from the quartz window 400. The primary function is the ultraviolet photo-detector pre-amplifier circuit 424 including the sensor 10. The input sensitivity is conditioned by a low noise reference circuit 448, transducing the photo-current to a signal voltage. The signal voltage is converted to a digital value by a switched-capacitor successive approximation converter 428, SAR converter 428. The SAR converter 428 is controlled by a self-timed state machine 452. Data from the SAR converter 428 is passed to a slave interface 432 and transmitted out of the module 416 on a serial transmission line 444. Valid data is acknowledged from the master 440. Data line 444, acknowledge line 440 and power signal 436, ground signal 438 run across six wires bundled in a hermetically sealed cable 420.

FIG. 5 depicts the invention in a diesel engine control loop 501. Engine control modules, ECMs 576, and high pressure oil injection, HEUI 572, systems are controlled by mechanical position sensors in state of the art fuel injection control systems. These systems rely on mechanical feedback of engine crank angle to manage the fuel injection profile. The present invention introduces a new, information-rich feedback path from the diesel engine to the engine control module 576 using the probe 401 and the integrated module 416. Fuel 104 and air is compressed in the combustion chamber 500 until homogenous charge compression ignition takes place. The combustion forces the piston 512 through its power stroke in the engine block 516. The combustion generates ultraviolet light 120 that is converted to a digital signature by the HCCI UV Digitizer probe 401. Again, the preferred embodiment utilizes the transistor 136, but could also use other silicon carbide devices. The preferred embodiment's HCCI UV Digitizer probe 401 is seated in the engine block head 402. The engine-block head 402 is liquid cooled via coolant channels 580 which allows reduced temperatures such that high temperature electronics at the non-combustion end of the probe 401 can operate in the 400° C.-500° C. range. The HCCI UV digital signatures are transmitted from each digitizer through the cables 420 and are captured by the digital cylinder interface circuit 560. Because engines can use one or multiple cylinders, a single sensor or multiple sensors may be utilized. Furthermore, more than one sensor may be used in a single cylinder. If multiple sensors are used, the signature processing unit 564 multiplexes the data streams from the cylinders and extracts real-time and accumulated data sets 568 including information such as ignition timing, combustion duration, combustion intensity, fuel type, fuel quality, efficiency information, pollutant information, engine health, and engine diagnostic information. Information in these data sets is used by the HEUI 572 to modify the fuel injection profile parameters and the ECM 576 to alter the fuel injection profile for the next combustion cycle.

Reference numerals used throughout the detailed description and the drawings correspond to the following elements:
Base connection B
Emitter connection E
Collector connection C
Substrate connection S
Light connection L
silicon carbide integrated sensor 10
package lead 100
biasing circuitry 103
wire bond 104
interconnect layers 108
light penetration zone 109
top surface 110
silicon carbide epitaxial layer 112 top surface 113
silicon handle wafer 116
ultraviolet light 120
collector bias circuit 124
base bias circuit 128
emitter bias circuit 132
ultraviolet sensitive silicon carbide bipolar transistor 136
substrate bias circuit 140
collector output node 144
emitter output node 148
thinned silicon handle wafer 200
back side 201
silicon epitaxial layer 208
electrical interconnection layer 216
silicon photo sensitive transistor 224
back-side thinned section 240
broad wavelength light 300
optical filter 304
filtered light 312
interconnection substrate 328
solder balls 340
probe 401
quartz window 400
engine block head 402
probe casing 404
combustion chamber end 405
compatible threading 408
torque facets 412
sensor electronics module 416
hermetically sealed cable 420
ultraviolet photo-detector pre-amplifier circuit 424
low noise reference circuit 448
switched-capacitor successive approximation converter 428
slave interface 432
power lines 436
ground signal 438
master acknowledge line 440
serial data transmission line 444
self-timed state machine 452
combustion chamber 500
diesel engine control loop 501
piston 512
engine block 516
digital cylinder interface circuit 560
signature processing unit 564
data sets 568
high pressure oil injection module 572
engine control modules 576
coolant channels 580

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A light sensor apparatus for sensing ultraviolet light, the apparatus comprising:
    a handle wafer,
    a silicon carbide epitaxial layer supported by the handle wafer,
    the silicon carbide epitaxial layer including a silicon carbide lateral bipolar junction transistor including a base connection, emitter connection, collector connection and substrate connection;
    an interconnect layer including a light penetration zone allowing the ultraviolet light to reach the silicon carbide lateral bipolar junction transistor.

2. The apparatus of claim 1, further comprising:
    the silicon carbide epitaxial layer further including a collector bias circuit electrically connected to the collector connection through the interconnect layer.

3. The apparatus of claim 1, further comprising:
    the silicon carbide epitaxial layer further including a base bias circuit electrically connected to the base connection through the interconnect layer.

4. The apparatus of claim 1, further comprising:
    the silicon carbide epitaxial layer further including an emitter bias circuit electrically connected to the emitter connection through the interconnect layer.

5. The apparatus of claim 1, further comprising:
    the silicon carbide epitaxial layer further including a substrate bias circuit electrically connected to the substrate connection through the interconnect layer.

6. The apparatus of claim 1, further comprising:
    at least one package lead wire bonded to the interconnect layer.

7. The apparatus of claim 1, wherein the silicon carbide lateral bipolar junction transistor is activated by light in the two hundred nanometer to three hundred and fifty nanometer wavelength range.

8. The apparatus of claim 1, wherein the silicon carbide lateral bipolar junction transistor remains passive when exposed to light below one hundred and fifty nanometers wavelength.

9. The apparatus of claim 1, wherein the silicon carbide lateral bipolar junction transistor remains passive when exposed to light above four hundred nanometers wavelength.

10. The apparatus of claim 1, wherein the silicon carbide lateral bipolar junction transistor remains operative at temperatures above one hundred and fifty degrees celcius.

* * * * *